United States Patent
Wang et al.

(10) Patent No.: US 11,075,676 B2
(45) Date of Patent: *Jul. 27, 2021

(54) FACILITATING SEMI-OPEN LOOP BASED TRANSMISSION DIVERSITY FOR UPLINK TRANSMISSIONS FOR 5G OR OTHER NEXT GENERATION NETWORKS

(71) Applicant: AT&T Intellectual Property I, L.P., Atlanta, GA (US)

(72) Inventors: Xiaoyi Wang, Austin, TX (US); Arunabha Ghosh, Austin, TX (US); SaiRamesh Nammi, Austin, TX (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/903,728

(22) Filed: Jun. 17, 2020

(65) Prior Publication Data

US 2020/0313737 A1 Oct. 1, 2020

Related U.S. Application Data

(63) Continuation of application No. 15/875,829, filed on Jan. 19, 2018, now Pat. No. 10,715,229.

(51) Int. Cl.
*H03M 13/29* (2006.01)
*H04B 7/0404* (2017.01)
(Continued)

(52) U.S. Cl.
CPC ...... *H04B 7/0478* (2013.01); *H03M 13/2909* (2013.01); *H04B 7/0404* (2013.01);
(Continued)

(58) Field of Classification Search
CPC ....... H04L 1/1812; H04L 5/0053; H04L 5/14; H04L 5/1469; H04L 5/0048; H04W 52/04;
(Continued)

(56) References Cited

U.S. PATENT DOCUMENTS 9,331,767 B1 * 5/2016 Thomas ............... H04B 7/0695
9,596,065 B2 3/2017 Chen et al.
(Continued)

OTHER PUBLICATIONS

Xia et al., "Improved SRS Design and Channel Estimation for LTE-Advanced Uplink" Microwave, Antenna, Propagation and EMC Technologies for Wireless Communications (MAPE), 2013 IEEE 5th International Symposium on. IEEE, 2013, pp. 84-90.

(Continued)

*Primary Examiner* — Melvin C Marcelo
*Assistant Examiner* — Natali Pascual Peguero
(74) *Attorney, Agent, or Firm* — Amin, Turocy & Watson, LLP

(57) ABSTRACT

Facilitating semi-open loop based transmission diversity for uplink transmissions in a communications network is provided herein. A system can comprise a processor and a memory that stores executable instructions that, when executed by the processor, facilitate performance of operations. The operations can comprise receiving, from a network device, information related to a sounding reference resource. The information related to the sounding reference resource can be based on a sounding reference signal resource transmission detected during a defined time interval. The operations can also comprise, based on a selected weight vector cycling, selecting a weight vector from defined weight vectors stored in the memory, resulting in a selected weight vector. Further, the operations can comprise transmitting, to the network device, a signal that comprises the selected weight vector multiplied with the sounding reference signal, during the selected weight vector cycling.

20 Claims, 10 Drawing Sheets

(51) Int. Cl.
*H04B 7/0456* (2017.01)
*H04L 1/00* (2006.01)
*H04B 7/26* (2006.01)

(52) U.S. Cl.
CPC ......... *H04B 7/0456* (2013.01); *H04L 1/0003* (2013.01); *H04B 7/2668* (2013.01)

(58) Field of Classification Search
CPC ........... H04W 52/325; H04W 72/0413; H04W 72/0446
USPC .................................................. 370/329, 254
See application file for complete search history.

(56) References Cited

U.S. PATENT DOCUMENTS

| | | | |
|---|---|---|---|
| 9,680,535 | B2 | 6/2017 | Onggosanusi et al. |
| 9,705,576 | B2 | 7/2017 | Hunukumbure |
| 9,876,554 | B2 | 1/2018 | Kazmi et al. |
| 2010/0120460 | A1 | 5/2010 | Karlsson et al. |
| 2012/0127948 | A1* | 5/2012 | Chung .................. H04L 5/0053 370/329 |
| 2013/0076566 | A1 | 3/2013 | Jiang et al. |
| 2013/0170452 | A1* | 7/2013 | Kwon .................. H04B 7/0456 370/329 |
| 2016/0192356 | A1 | 6/2016 | Lee et al. |
| 2016/0374060 | A1 | 12/2016 | Lim et al. |
| 2017/0188352 | A1* | 6/2017 | Lee ....................... H04L 5/0044 |
| 2017/0201300 | A1 | 7/2017 | Parkvall et al. |
| 2017/0294999 | A1 | 10/2017 | Patel et al. |
| 2017/0324455 | A1 | 11/2017 | Soriaga et al. |
| 2017/0332359 | A1 | 11/2017 | Tsai et al. |
| 2017/0366311 | A1* | 12/2017 | Iyer ....................... H04L 5/0007 |
| 2017/0373807 | A1 | 12/2017 | Hessler et al. |
| 2018/0019795 | A1 | 1/2018 | Zhang et al. |

OTHER PUBLICATIONS

Non-Final Office Action received for U.S. Appl. No. 15/875,829 dated Jan. 8, 2019, 30 pages.
Final Office Action received for U.S. Appl. No. 15/875,829 dated Jun. 28, 2019, 27 pages.
Non-Final Office Action received for U.S. Appl. No. 15/875,829 dated Nov. 25, 2019, 30 pages.

* cited by examiner

FACILITATING SEMI-OPEN LOOP BASED TRANSMISSION DIVERSITY FOR UPLINK TRANSMISSIONS FOR 5G OR OTHER NEXT GENERATION NETWORKS

RELATED APPLICATION

The subject patent application is a continuation of, and claims priority to, U.S. patent application Ser. No. 15/875,829, now U.S. Pat. No. 10,715,229, filed Jan. 19, 2018, and entitled "FACILITATING SEMI-OPEN LOOP BASED TRANSMISSION DIVERSITY FOR UPLINK TRANSMISSIONS FOR 5G OR OTHER NEXT GENERATION NETWORKS," the entirety of which application is hereby expressly incorporated by reference herein.

TECHNICAL FIELD

The subject disclosure relates generally to communications systems, and for example, to facilitating semi-open loop based transmission diversity for uplink transmissions for 5G or other next generation networks.

BACKGROUND

To meet the huge demand for data centric applications, Third Generation Partnership Project (3GPP) systems and systems that employ one or more aspects of the specifications of the Fourth Generation (4G) standard for wireless communications will be extended to a Fifth Generation (5G) standard for wireless communications. Unique challenges exist to provide levels of service associated with forthcoming 5G, or other next generation, standards for wireless communication.

BRIEF DESCRIPTION OF THE DRAWINGS

Various non-limiting embodiments are further described with reference to the accompanying drawings in which.

DETAILED DESCRIPTION

Figure 1:
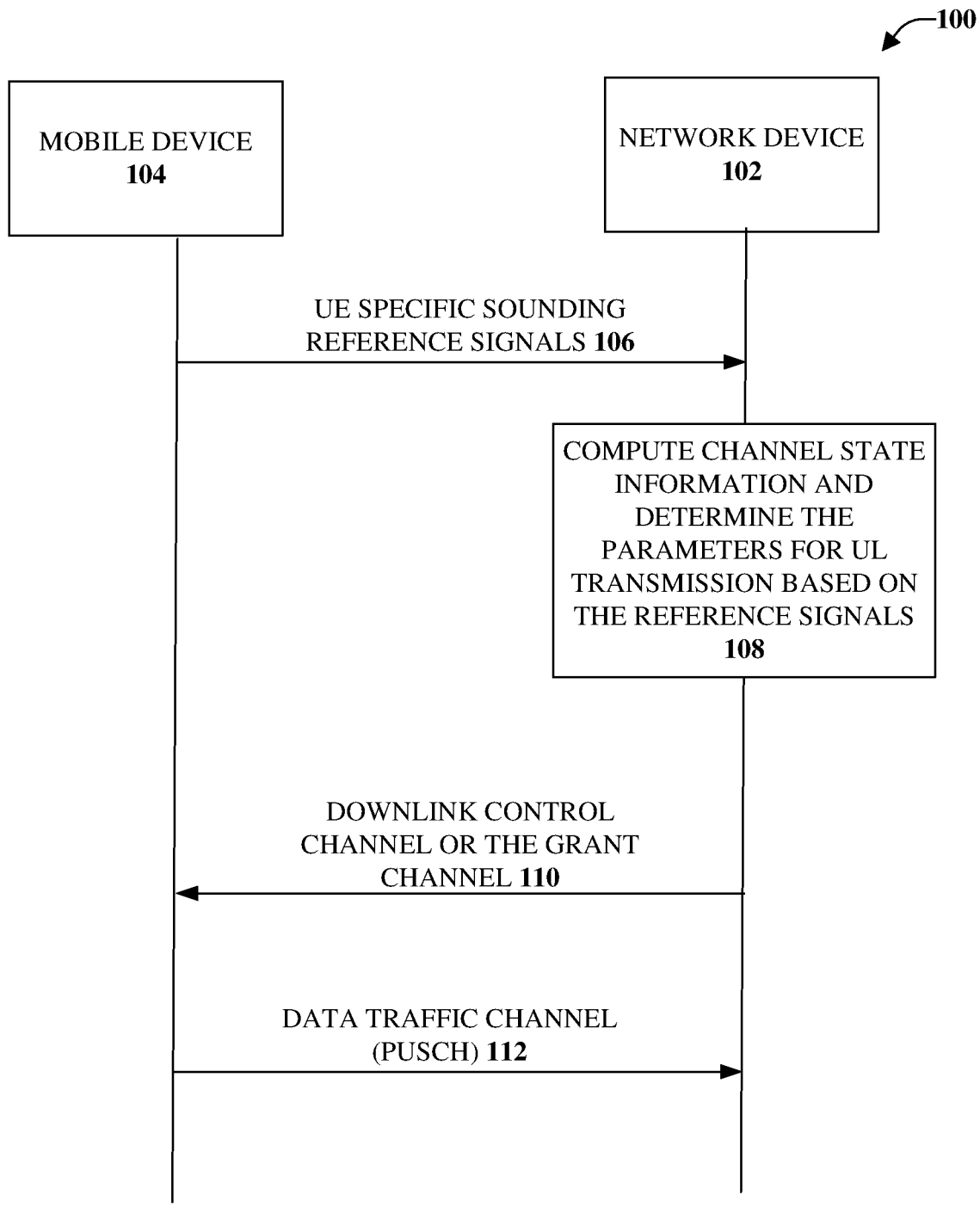
FIG. 1 illustrates an example, non-limiting message sequence flow chart for uplink data transfer in 5G systems in accordance with one or more embodiments described herein.

One or more embodiments are now described more fully hereinafter with reference to the accompanying drawings in which example embodiments are shown. In the following description, for purposes of explanation, numerous specific details are set forth in order to provide a thorough understanding of the various embodiments. However, the various embodiments can be practiced without these specific details (and without applying to any particular network environment or standard).

Discussed herein are various aspects that relate to facilitating semi-open loop based transmission diversity design for uplink channels for 5G or other next generation networks. For example, as discussed herein, the one or more aspects, can implicitly define a candidate set of precoders (or weight vectors) from which a mobile device (e.g., a user equipment (UE)) can randomly select a precoder (e.g., a weight vector). Further, the randomization of the precoder (e.g., the weight vector) can be maintained in order to achieve transmission diversity while keeping the selection of the precoder (e.g., the weight vector), to some extent known, by the network device (e.g., based on the selected weight vector being a weight vector selected from the candidate set of weight vector).

The disclosed aspects can provide several advantages including, for example, that the network device can estimate a Channel Quality Indicator (CQI) with the candidate precoder (e.g., through a precoded Sounding Reference Signal (SRS) received earlier). Another advantage is that the network device can assist to ensure the performance will be acceptable since the precoders are selected from the candidate set of precoders and, therefore, any precoder that is selected has been previously used for SRS transmission. Accordingly, the network device has estimated the channel based on SRS using those precoders.

The various aspects described herein can relate to new radio, which can be deployed as a standalone radio access technology or as a non-standalone radio access technology assisted by another radio access technology, such as Long Term Evolution (LTE), for example. It should be noted that although various aspects and embodiments have been described herein in the context of 5G, Universal Mobile Telecommunications System (UMTS), and/or LTE, or other next generation networks, the disclosed aspects are not limited to 5G, a UMTS implementation, and/or an LTE implementation as the techniques can also be applied in 3G, 4G, or LTE systems. For example, aspects or features of the disclosed embodiments can be exploited in substantially any wireless communication technology. Such wireless communication technologies can include UMTS, Code Division Multiple Access (CDMA), Wi-Fi, Worldwide Interoperability for Microwave Access (WiMAX), General Packet Radio Service (GPRS), Enhanced GPRS, Third Generation Partnership Project (3GPP), LTE, Third Generation Partnership Project 2 (3GPP2) Ultra Mobile Broadband (UMB), High Speed Packet Access (HSPA), Evolved High Speed Packet Access (HSPA+), High-Speed Downlink Packet Access (HSDPA), High-Speed Uplink Packet Access (HSUPA), Zigbee, or another IEEE 802.XX technology. Additionally, substantially all aspects disclosed herein can be exploited in legacy telecommunication technologies. Further, the various aspects can be utilized with any Radio Access Technology (RAT) or multi-RAT system where the mobile device operates using multiple carriers (e.g., LTE Frequency Division Duplexing (FDD)/Time-Division Duplexing (TDD), Wideband Code Division Multiplexing Access (WCMDA)/ HSPA, Global System for Mobile Communications (GSM)/ GSM EDGE Radio Access Network (GERAN), Wi Fi, Wireless Local Area Network (WLAN), WiMax, CDMA2000, and so on).

As used herein, "5G" can also be referred to as New Radio (NR) access. Accordingly, systems, methods, and/or machine-readable storage media for facilitating improvements to the uplink performance for 5G systems are desired. As used herein, one or more aspects of a 5G network can comprise, but is not limited to, data rates of several tens of megabits per second (Mbps) supported for tens of thousands of users; at least one gigabit per second (Gbps) to be offered simultaneously to tens of users (e.g., tens of workers on the same office floor); several hundreds of thousands of simultaneous connections supported for massive sensor deployments; spectral efficiency significantly enhanced compared to 4G; improvement in coverage relative to 4G; signaling efficiency enhanced compared to 4G; and/or latency significantly reduced compared to LTE.

In one embodiment, described herein is a system that can comprise a processor and a memory that stores executable instructions that, when executed by the processor, facilitate performance of operations. The operations can comprise receiving, from a network device, information related to a sounding reference resource. The information related to the sounding reference resource can be based on a sounding reference signal resource transmission detected during a defined time duration. The operations can also comprise, based on a selected weight vector cycling, selecting a weight vector from defined weight vectors stored in the memory, resulting in a selected weight vector. Further, the operations can comprise transmitting, to the network device, a signal that comprises the selected weight vector multiplied with a sounding reference signal, during the selected weight vector cycling.

In an example, selecting the weight vector from the defined weight vectors stored in the memory can comprise randomly selecting the weight vector from the defined weight vectors stored in the memory. In another example, the selected weight vector can be used for an entire bandwidth for the transmitting the signal that comprises the selected weight vector multiplied with the sounding reference signal.

According to another example, the selected weight vector can be a first weight vector and the transmission of the signal can be a first transmission of a first signal. Further to this example, the operations can comprise, based on the selected weight vector cycling, selecting a second weight vector from the defined weight vectors stored in the memory for a second transmission of a second signal that comprises the second weight vector multiplied with the sounding reference signal.

In another example, selecting the first weight vector and selecting the second weight vector can be based on a defined granularity level associated with the first transmission and the second transmission.

In some aspects, receiving the information related to the sounding reference resource can comprise receiving downlink control information that indicates the sounding reference resource for an uplink transmission. Further, the defined time duration can be a time window prior to a current time and can comprise a configurable length.

According to some aspects, the operations can further comprise, prior to the receiving the information related to the sounding reference resource, receiving, from the network device, a configuration of a non-codebook based transmission protocol for an uplink channel. Further to these aspects, the uplink channel can be a physical uplink shared channel. Further, selecting the weight vector from the defined weight vectors stored in the memory can facilitate a transmission diversity associated with transmissions of the device.

In some implementations, transmitting the selected weight vector multiplied with the sounding reference signal during the selected weight vector cycling can comprise transmitting data via a downlink control channel (e.g., sounding resource indicator) configured to operate according to a fifth-generation wireless communication network protocol.

Another embodiment can relate to a method that can comprise facilitating, by a device comprising a processor and from a network device, receiving sounding reference resource information for use by the device during an uplink transmission. The method can also comprise selecting, by the device, a weight vector from a group of defined weight vectors stored on the device and facilitating, by the device, sending the uplink transmission using a multiple of the weight vector and a sounding reference signal. The indication of the sounding reference resource information can comprise sounding reference resource information determined to have been used by the device to transmit sounding reference signals during a defined duration.

In an example, sending the uplink transmission can comprise periodically sending a sounding reference resource transmission. In another example, sending the uplink transmission can comprise aperiodically sending a sounding reference resource transmission. In accordance with an example, the defined duration can be a time window prior to a current time and can comprise a configurable length.

According to an aspect, prior to the receiving the sounding reference resource information, the method can include facilitating, from the network device, receiving a configuration of a non-codebook based transmission protocol for an uplink channel In some aspects, the method can comprise determining, by the device, a weight vector cycling to use for the uplink transmission.

In accordance with another example, sending the uplink transmission can comprise sending the uplink transmission via a physical uplink shared channel. Further to this example, selecting the weight vector from the group of defined weight vectors stored on the device can facilitate transmission diversity of transmissions of the device.

Yet another embodiment can relate to a machine-readable storage medium, comprising executable instructions that, when executed by a processor of a network device of a wireless network, facilitate performance of operations. The operations can comprise determining sounding reference resource information for use by a mobile device based on a previous sounding reference signal transmission transmitted by the mobile device during a defined time duration. The operations can also comprise facilitating a transmission, to the mobile device, that comprises the sounding reference resource information for use by the mobile device.

In an example, the operations can also comprise determining respective channel quality indexes of the sounding reference signals transmitted by the mobile device. Further to this example, determining the respective channel quality indexes can comprise estimating the respective channel quality indexes based on previously received signaling reference signals received during the defined time duration.

According to another example, the operations can comprise configuring the mobile device with a non-codebook based transmission protocol for uplink transmissions by the mobile device.

In further detail, transmission diversity is a technology utilized to resist deep fading from radio propagation. The transmission diversity (TxD) transmission protocol has been adopted in LTE. New Radio (NR) does not explicit support a TxD transmission mode or transmission protocol. Instead, NR supports transmission diversity in an implicit manner More specifically, the precoder cycling transmission can be achieved through Physical Resource Block (PRB) bundling (e.g., random precoder selection for each Physical Resource Group (PRG)).

In 5G systems, the standard specifies a transparent scheme as the diversity protocol, where the transmitter can use precoder cycling the traffic channel, therefore providing diversity gain. It is noted that there are other diversity techniques such as Space-Frequency Block-Coded (SFBC), as in LTE. However, these protocols utilize standard specifications and more interference compared to the transparent diversity schemes. In comparison to Physical Downlink Shared Channel (PDSCH), a specification transparent transmission diversity scheme is difficult from a design point of view. This is because the specification transparent transmission diversity scheme grants the mobile device the freedom to select precoders up to its implementation. If a mobile device can randomly select the precoder for a Physical Uplink Shared Channel (PUSCH), network performance is difficult to guaranteed since different mobile device chipset vendors could adopt different selection algorithms In an extreme case, some mobile device vendors could simply select only one precoder without any cycling. In other words, the network cannot grant full freedom to mobile devices on the transmission parameters because of the risk of performance degradation. Therefore, any random precoder cycling protocol should be, to some extent, under control of the network, as provided herein.

Another problem of the random precoder selection is the CQI estimation. Random selection of the precoder means there are an infinite number of possibilities of different precoders. However, the CQI estimation is based on a certain precoder, and, therefore, it can be difficult for the network device to calculate CQI with a completely random precoder selection. Accordingly, the disclosed aspects can generate a group of candidate precoders or weight vectors and the mobile device can select one or more precoders (or weight vectors) from the group of candidate precoders.

FIG. 1 illustrates an example, non-limiting message sequence flow chart 100 for uplink data transfer in 5G systems in accordance with one or more embodiments described herein. The non-limiting message sequence flow chart 100 can be utilized for new radio, as discussed herein. As illustrated, the non-limiting message sequence flow chart 100 represents the message sequence between a network device 102 and a mobile device 104.

The term "mobile device" can be interchangeable with (or include) a user equipment (UE) or other terminology. Mobile device (or user equipment) refers to any type of wireless device that communicates with a radio network node in a cellular or mobile communication system. Examples of UEs include, but are not limited to, a target device, a device to device (D2D) UE, a machine type UE or a UE capable of machine to machine (M2M) communication, a Personal Digital Assistant (PDA), a tablet, a mobile terminal, a smart phone, a laptop embedded equipment (LEE), a laptop mounted equipment (LME), a Universal Serial Bus (USB) dongle, and so on.

As used herein, the term "network device" can be interchangeable with (or include) a network, a network controller or any number of other network components. Further, as utilized herein, the non-limiting term radio network node, or simply network node (e.g., network device, network node device) is used herein to refer to any type of network node serving communications devices and/or connected to other network nodes, network elements, or another network node from which the communications devices can receive a radio signal. In cellular radio access networks (e.g., universal mobile telecommunications system (UMTS) networks), network devices can be referred to as base transceiver stations (BTS), radio base station, radio network nodes, base stations, NodeB, eNodeB (e.g., evolved NodeB), and so on. In 5G terminology, the network nodes can be referred to as gNodeB (e.g., gNB) devices. Network devices can also comprise multiple antennas for performing various transmission operations (e.g., Multiple Input Multiple Output (MIMO) operations). A network node can comprise a cabinet and other protected enclosures, an antenna mast, and actual antennas. Network devices can serve several cells, also called sectors, depending on the configuration and type of antenna. Examples of network nodes or radio network nodes (e.g., the network device 102) can include but are not limited to: NodeB devices, base station (BS) devices, access point (AP) devices, TRPs, and radio access network (RAN) devices. The network nodes can also include multi-standard radio (MSR) radio node devices, comprising: an MSR BS, a gNodeB, an eNode B, a network controller, a radio network controller (RNC), a base station controller (BSC), a relay, a donor node controlling relay, a base transceiver station (BTS), an access point (AP), a transmission point, a transmission node, a Remote Radio Unit (RRU), a Remote Radio Head (RRH), nodes in distributed antenna system (DAS), and the like.

The mobile device 104 can transmit sounding reference signals, at 106, that are specific to the mobile device (e.g., UE specific). From the sounding reference signals, the network device 102 can compute the channel estimates and can also compute the parameters needed for channel state information (CSI) determination, at 108. The determination performed by the network device 102 (e.g., at 108) based on the received reference signals can also comprise, for example, determining the channel quality indicator (CQI) and/or modulation and coding scheme (MCS), Transmit Precoding Matrix Index (TPMI), Transmit Rank Information (TRI), power, Physical Resource Blocks (PRBs), and so on.

Upon or after the network device 102 determines the parameters needed for scheduling uplink data, the network device 102 can inform the mobile device 104 of these parameters through a grant channel, also referred to as downlink control channel information (PDCCH), at 110. Upon or after the mobile device 104 receives the grant information, the mobile device 104 can transmit the uplink data using the Physical Uplink Shared Channel (PUSCH), at 112.

Uplink reference signals are predefined signals occupying specific resource elements within the uplink time-frequency grid. There can be at least two types of uplink reference signals that can be transmitted in different ways and used for different purposes by the network device 102, namely, sounding reference signals (SRS) and demodulation reference signals (DM-RS).

Sounding reference signals are specifically intended to be used by the network device 102 to acquire channel-state information (CSI) and beam specific information. In 5G systems, the sounding reference signals can be mobile device 104 specific and, therefore, can have a significantly lower time/frequency density.

Demodulation reference signals are specifically intended to be used by the network device 102 for channel estimation for data channel between the network device 102 and the mobile device 104. The label "UE-specific" relates to the fact that each demodulation reference signal is intended for channel estimation by the network device 102 from a specific mobile device 104. That specific reference signal is then only transmitted within the resource blocks assigned for data traffic channel transmission to that terminal (e.g., the mobile device 104). Since the data is precoded, the DM-RS is also precoded with the same precoding used to precode the data.

Figure 2:
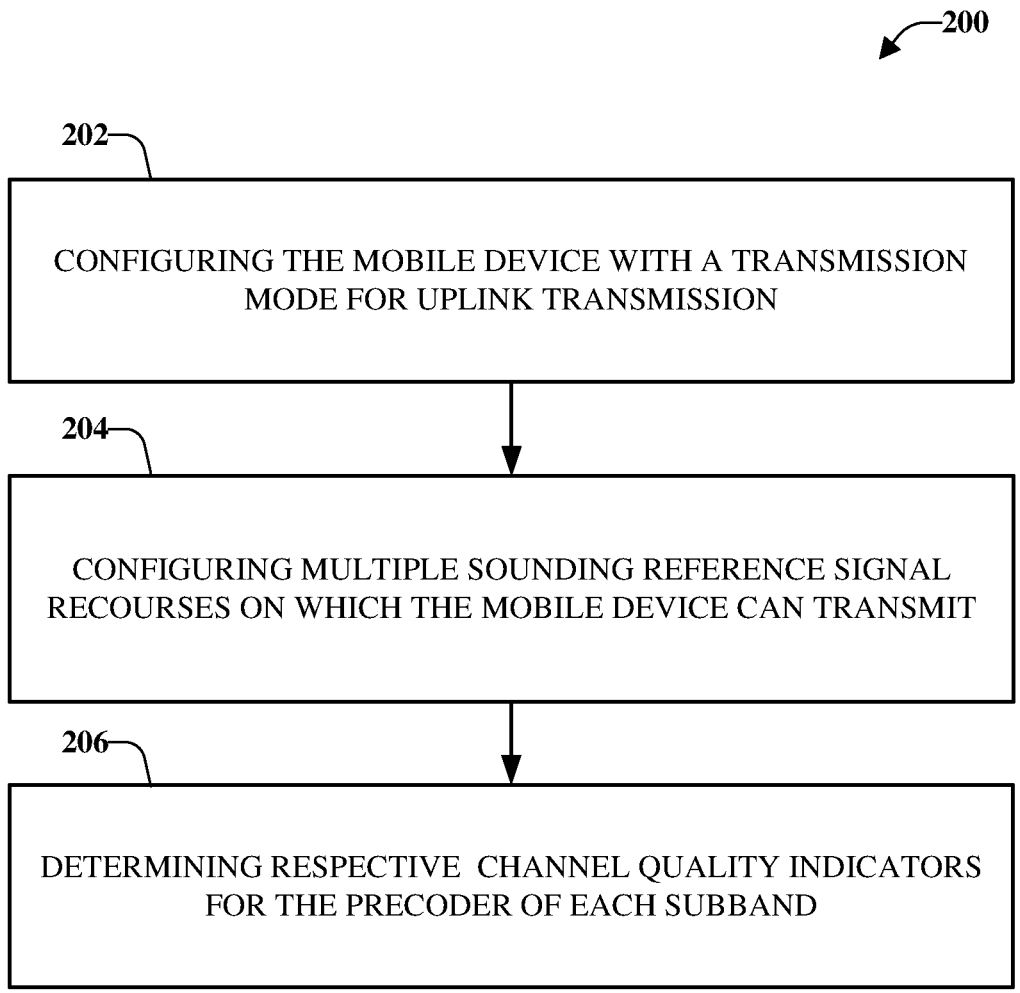
FIG. 2 illustrates an example, non-limiting method for facilitating semi-open loop based transmission diversity design in a communications network in accordance with one or more embodiments described herein.

FIG. 2 illustrates an example, non-limiting, method 200 for facilitating semi-open loop based transmission diversity design in a communications network in accordance with one or more embodiments described herein. Repetitive description of like elements employed in other embodiments described herein is omitted for sake of brevity. The method 200 can be implemented by a network device of a wireless network, the network device comprising a processor. Alternatively, or additionally, a machine-readable storage medium can comprise executable instructions that, when executed by a processor, facilitate performance of operations for the method 200.

The method 200 can provide the network device (e.g., the network device 102) with some control of a precoder or weight vector selection of a mobile device (e.g., the mobile device 104). The method 200 starts at 202 when the network node configures the mobile device with a transmission mode for uplink transmission. For example, the mobile device can be configured in non-codebook based transmission protocol for PUSCH transmission. At 204, the network device can configure the mobile device with multiple sounding reference signal resources on which the mobile device can transmit.

According to some implementations, the network device can use DCI to indicate to the mobile device which sounding reference signal resource to choose for the PUSCH transmission. This can be indicated as part of the SRI (sounding resource indicator). The network device can choose the SRI based on which SRS resource provides the best capacity, according to an implementation. However, other techniques can be used to decide SRI and the disclosed aspects are intended to utilize the various techniques for deciding SRI.

According to an additional or alternative embodiment, the network device can use DCI to indicate to the mobile device that the mobile device can randomly select a precoder for each subband of the scheduled PUSCH. As utilized herein, to "randomly" select" means that the mobile device can only select a precoder from the candidate set. Further, the candidate set includes precoders that have been used to transmit any SRS during a recent period of time. The length of the period of time can be configured by high layers. The SRS transmission can include an aperiodic transmission and/or a periodic transmission. The subband definition can be the same as PRG in PRB bundling in PDSCH. Further, the DCI can use some separate bits or reuse one state of SRI bits to indicate the precoder cycling.

At 206, the network device can determine the respective CQIs for the precoder of each subband. For example, the network device does not know which precoder (e.g., weight vector) will be selected and, therefore, determines the CQIs for all the precoders in the candidate set since any precoder (e.g., weight vector) can be selected. Accordingly, the network device assumes the precoder of each subband is randomly selected from the candidate set when determining the respective CQIs. Although, the network device does not know the exact precoder in the candidate set that will be selected, the network device knows the receive signals of SRS using that precoder.

Figure 3:
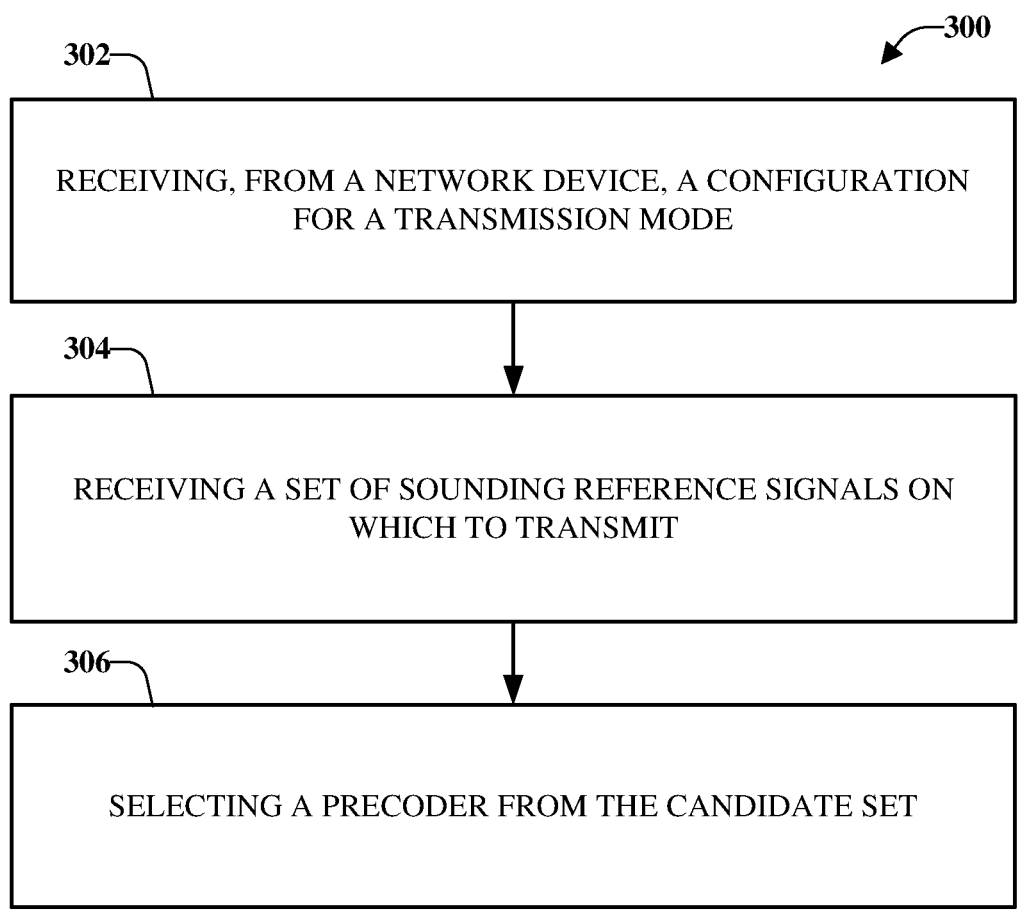
FIG. 3 illustrates an example, non-limiting method for weight vector selection in a communications network in accordance with one or more embodiments described herein.

FIG. 3 illustrates an example, non-limiting, method 300 for weight vector selection in a communications network in accordance with one or more embodiments described herein. Repetitive description of like elements employed in other embodiments described herein is omitted for sake of brevity. The method 300 can be implemented by a mobile device of a wireless network, the mobile device comprising a processor. Alternatively, or additionally, a machine-readable storage medium can comprise executable instructions that, when executed by a processor, facilitate performance of operations for the method 300.

The various aspects discussed herein can provide a semi-open loop based transmission diversity protocol. For example, the various aspects can construct a candidate precoder set based on a previous SRS transmission. By allowing a mobile device to select a precoder from the candidate precoder set, the network device can estimate a CQI of the transmission diversity based PUSCH with a high percentage of accuracy.

At 302, a mobile device (e.g., the mobile device 104) can receive, from a network device (e.g., the network device 102), a configuration for a transmission mode. For example, the mobile device can be configured with a non-codebook based transmission protocol for PUSCH. At 304, the mobile device can receive a set of sounding reference signals on which to transmit (e.g., locations).

At 306, the mobile device can select a precoder (e.g., weight vector) from the candidate set. For example, the candidate set can include precoders (e.g., weight vectors) that have been used to transmit any SRS during a recent period of time. The period of time can be determined by the network device and can be configurable. According to an implementation, the mobile device can select the precoder for each SRS transmission. The SRS transmission can be periodically or aperiodically transmitted. In some implementations, the mobile device utilizes only one precoder for the entire bandwidth for SRS transmission.

In other implementations, the mobile device can use precoder cycling at a defined granularity level (e.g., Resource Block (RB) level, where a group of RBs is also referred to as a PRG level). For example, the network device can use DCI to indicate to the mobile device to randomly select a precoder for each subband of the scheduled PUSCH. The DCI can use separate bits or reuse one state of SRI bits to indicate the precoder cycling. Upon or after the mobile device receives the SRI, the mobile device can choose the precoder cycling as done in SRS transmission and can multiply the same precoder cycling for PUSCH and DM-RS.

Figure 4:
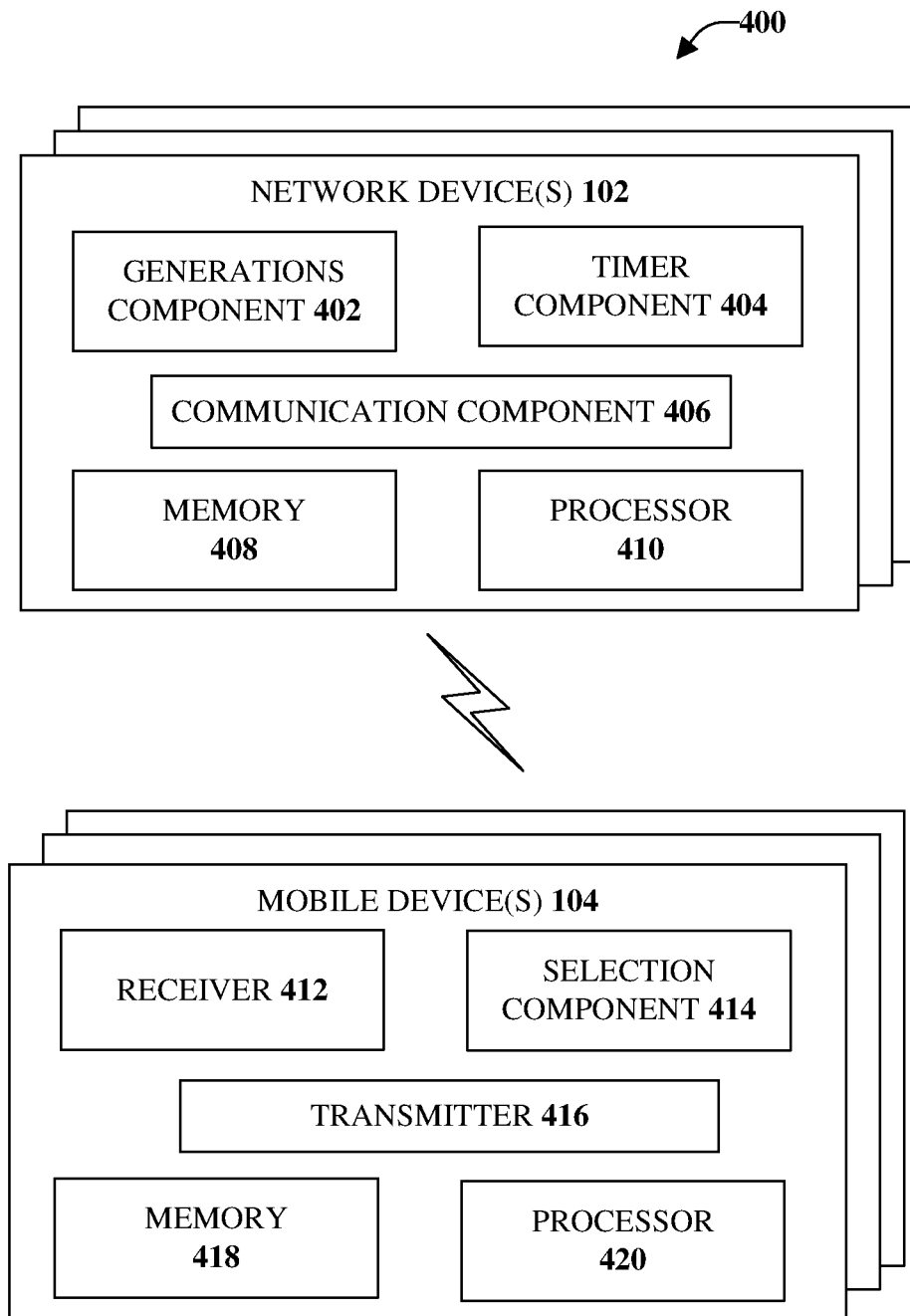
FIG. 4 illustrates an example, non-limiting communications system for facilitating semi-open loop based transmission diversity design for uplink transmissions in communications networks in accordance with one or more embodiments described herein.

FIG. 4 illustrates an example, non-limiting, communications system 400 for facilitating semi-open loop based transmission diversity design for uplink transmissions in communications networks in accordance with one or more embodiments described herein. Repetitive description of like elements employed in other embodiments described herein is omitted for sake of brevity.

The communications system 400 can comprise one or more network devices (illustrated as the network device 102) and one or more user equipment or mobile devices (illustrated as the mobile device 104). The network device 102 can be included in a group of network devices of a wireless network. It is noted that although only a single network device and a single mobile device are illustrated, the communications system 400 can comprise a multitude of mobile devices and/or a multitude of network devices.

The network device 102 can comprise a generation component 402, a timer component 404, a communication component 406, at least one memory 408, and at least one processor 410. Further, the mobile device 104 can comprise a receiver 412, a selection component 414, a transmitter 416, at least one memory 418, and at least one processor 420.

The generation component 402 can be configured to determine sounding reference resource information for use by the mobile device 104 based on a previous sounding reference signal transmission transmitted by the mobile device 104 during a defined time duration. In an example, the sounding reference resource can include locations (e.g., time and/or frequency resources) where the reference signals were transmitted from the mobile device to the network device.

The defined time duration can be a time window prior to a current time and can comprise a configurable length. For example, the defined time duration can be determined by the network device 102 and can be measured by the timer component 404. The communication component 406 can be configured to facilitate a transmission, to the mobile device 104, that comprises sounding reference resource information for use by the mobile device 104.

The mobile device 104 can receive the transmission via the receiver 412 and the selection component 414 can select a weight vector from defined weight vectors stored in the memory 418, for example. Upon or after selection of the weight vector, the mobile device 104 can facilitate sending an uplink transmission that comprises the weight vector multiplied with the sounding reference signal via the transmitter 416.

The respective one or more memories 408, 418 can be operatively coupled to the respective one or more processors 410, 420. The respective one or more memories 408, 418 can store protocols associated with facilitating a semi-open loop based transmission diversity of a communications network as discussed herein. Further, the respective one or more memories 408, 418 can facilitate action to control communication between the network device 102 and the mobile device 104, such that the communications system 400 can employ stored protocols and/or algorithms to achieve improved communications in a wireless network as described herein.

It should be appreciated that data store (e.g., memories) components described herein can be either volatile memory or nonvolatile memory, or can include both volatile and nonvolatile memory. By way of example and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of example and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Memory of the disclosed aspects are intended to comprise, without being limited to, these and other suitable types of memory.

The respective processors 410, 420 can facilitate improvements to achieve transmission diversity in a communication network. The processors 410, 420 can be processors dedicated to analyzing and/or generating information received, processors that control one or more components of the communications system 400, and/or processors that both analyze and generate information received and control one or more components of the communications system 400.

Figure 5:
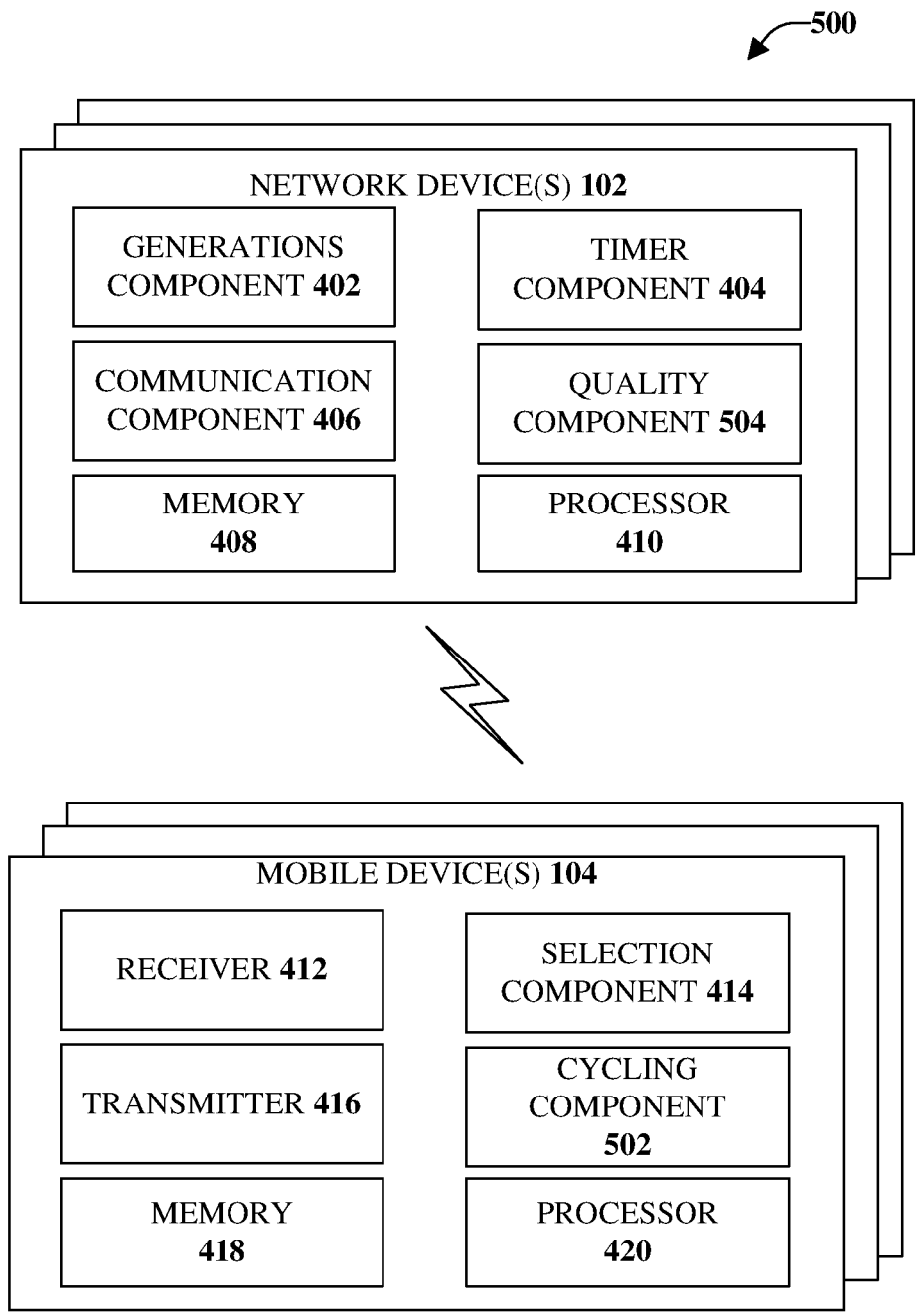
FIG. 5 illustrates an example, non-limiting, communications system for utilizing precoder cycling to select one or more weight vectors for an uplink transmission in accordance with one or more embodiments described herein.

FIG. 5 illustrates an example, non-limiting, communications system 500 for utilizing precoder cycling to select one or more weight vectors for an uplink transmission in accordance with one or more embodiments described herein. Repetitive description of like elements employed in other embodiments described herein is omitted for sake of brevity. The communications system 500 can comprise one or more of the components and/or functionality of the communications system 400 and vice versa.

As illustrated, the mobile device 104 can comprise a cycling component 502 the can be configured to determine whether to use one weight vector or to use more than one weight vector for the sounding reference signal. For example, in an implementation, the cycling component 502 can determine that one weight vector should be utilized for an entire bandwidth for transmission of a sounding reference signal. In another implementation, the cycling component 502 can determine that precoder cycling should be utilized at a certain granularity level. For example, the granularity level can be a Resource Block (RB) level, where a group of RBs is also referred to as a PRG level.

The network device 102 can comprise a quality component 504 that can be configured to determine respective channel quality indexes of the sounding reference signals transmitted by the mobile device. For example, determining the respective channel quality indexes can comprise estimating the respective channel quality indexes based on previously received signaling reference signals received during the defined time duration.

Figure 6:
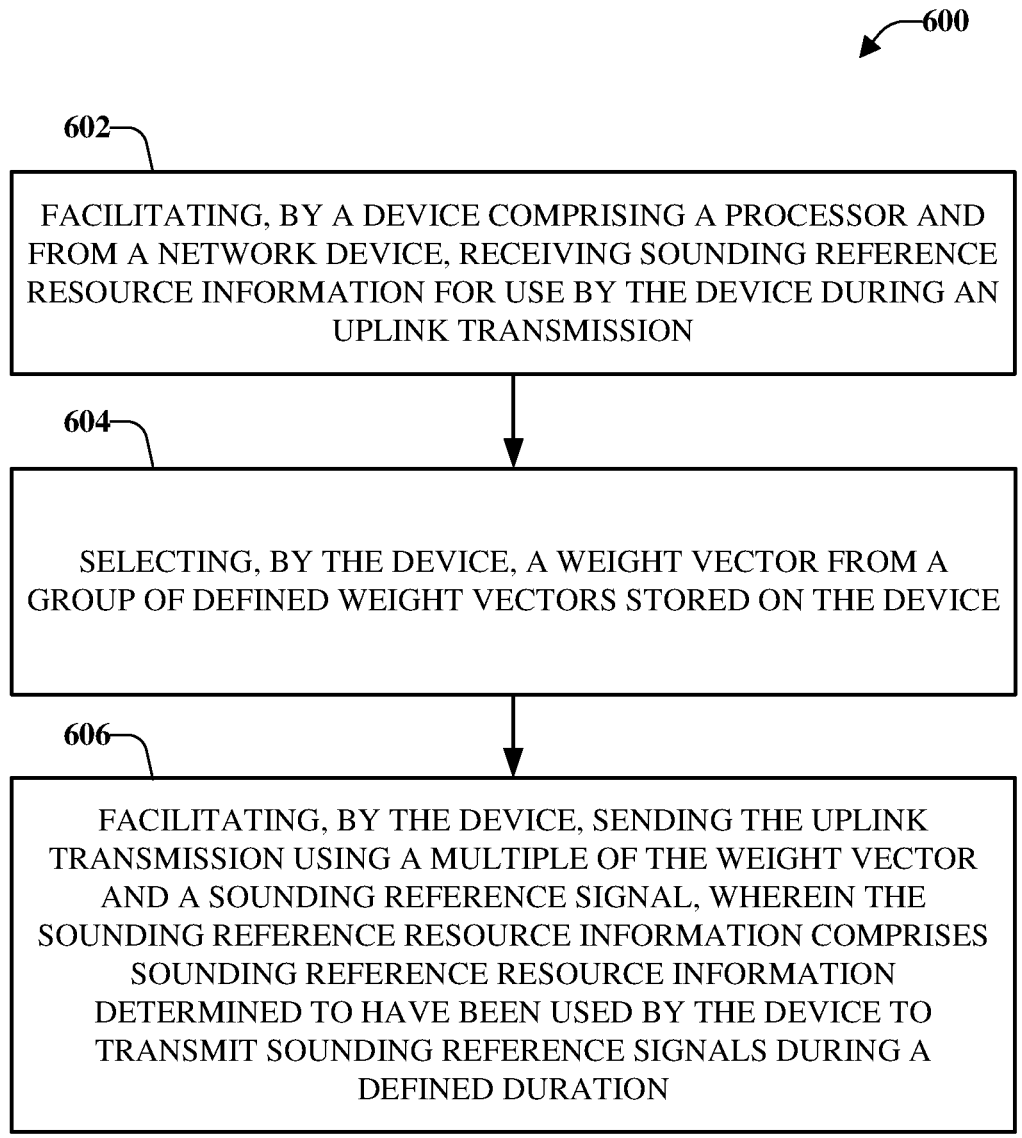
FIG. 6 illustrates an example, non-limiting method for selecting one or more weight vectors from a group of defined weight vectors in accordance with one or more embodiments described herein.

FIG. 6 illustrates an example, non-limiting, method 600 for selecting one or more weight vectors from a group of defined weight vectors in accordance with one or more embodiments described herein. Repetitive description of like elements employed in other embodiments described herein is omitted for sake of brevity. The method 600 can be implemented by a mobile device of a wireless network, the mobile device comprising a processor. Alternatively, or additionally, a machine-readable storage medium can comprise executable instructions that, when executed by a processor, facilitate performance of operations for the method 600.

At 602, a device (e.g., the mobile device 104) can facilitate receiving sounding reference resource information for use by the device during an uplink transmission. The sounding reference resource information can comprise information related to sounding reference resources determined to have been used by the device to transmit sounding reference signals during a defined duration. According to an implementation, the defined duration can be a time window prior to a current time and can comprise a configurable length.

A weight vector from a group of defined weight vectors stored on the device can be selected, at 604. For example, the group of defined weight vectors can be pre-defined weight vectors. In an implementation, selecting the weight vector can comprise randomly selecting the weight vector from the group of defined weight vectors stored on the device.

Further, at 606, the device can facilitate sending the uplink transmission using a multiple of the weight vector and the sounding reference signal. According to an implementation, sending the uplink transmission can comprise periodically sending a sounding reference resource transmission. According to an alternate implementation, sending the uplink transmission can comprise aperiodically sending a sounding reference resource transmission. In an example, sending the uplink transmission can comprise sending the uplink transmission via a physical uplink shared channel. Further to this example, selecting the weight vector from the group of defined weight vectors can facilitate transmission diversity of transmissions of the device.

Figure 7:
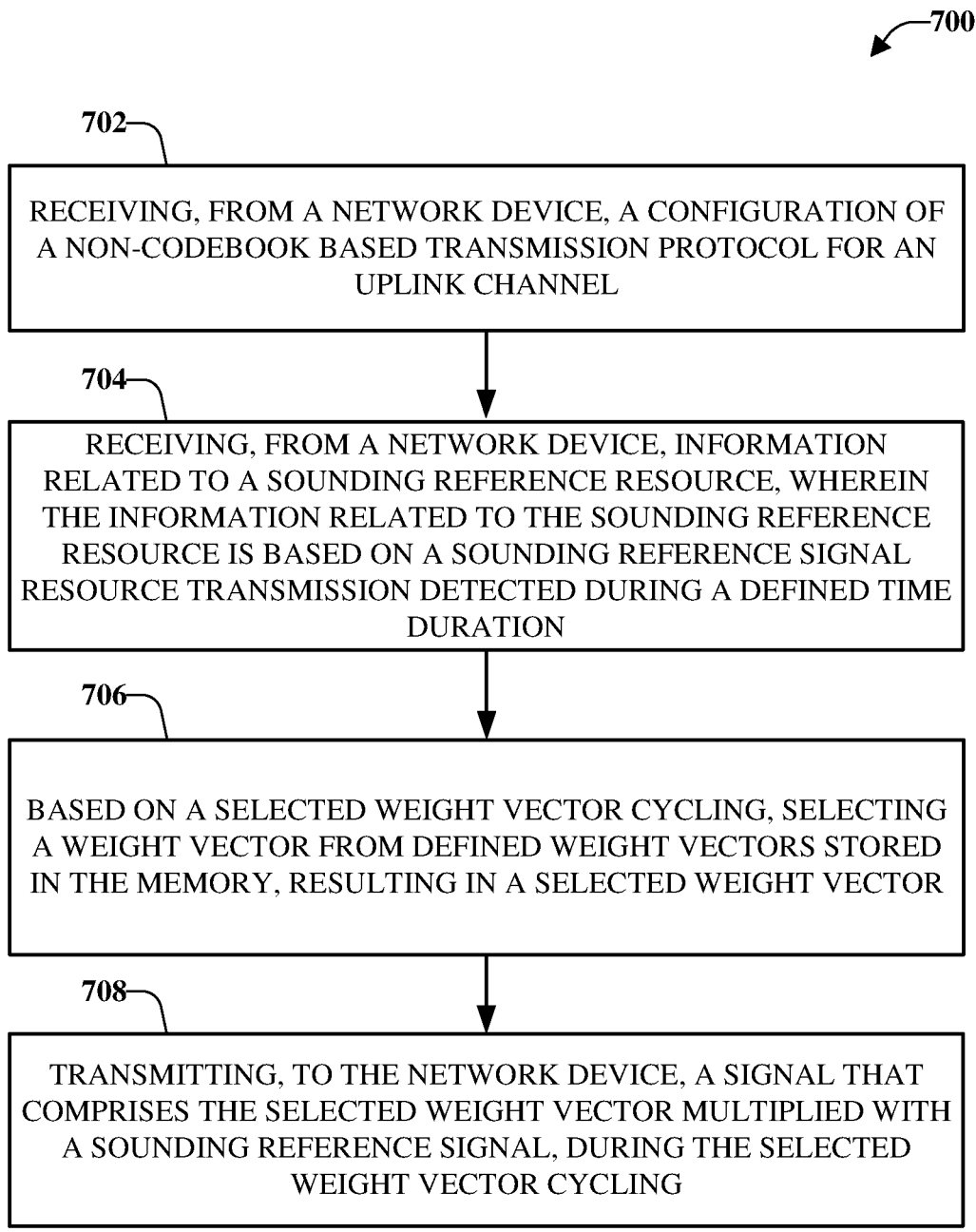
FIG. 7 illustrates an example, non-limiting method for facilitating transmission diversity in a communications network in accordance with one or more embodiments described herein.

FIG. 7 illustrates an example, non-limiting, method 700 for facilitating transmission diversity in a communications network in accordance with one or more embodiments described herein. Repetitive description of like elements employed in other embodiments described herein is omitted for sake of brevity. The method 700 can be implemented by a mobile device of a wireless network, the mobile device comprising a processor. Alternatively, or additionally, a machine-readable storage medium can comprise executable instructions that, when executed by a processor, facilitate performance of operations for the method 700.

At 702, the device (e.g., the mobile device 104) can receive from the network device (e.g., the network device 102) a configuration of a non-codebook based transmission protocol for an uplink channel. For example, the network device can configure the mobile device with the non-codebook based transmission protocol for PUSCH.

Further, at 704, the device can receive, from the network device, information related to a sounding reference resource. The information related to the sounding reference resource can be based on a sounding reference signal resource transmission detected during a defined time duration. For example, the network device can detect the sounding reference signals over the defined time duration (prior to a current time) and select, at least some, of the sounding reference signals detected for inclusion in the information related to the sounding reference resource. In an implementation, receiving the information related to the sounding reference resource can comprise receiving downlink control information that indicates the information related to the sounding reference resource for an uplink transmission.

Based on a selected weight vector cycling, at 706, the mobile device can select a weight vector from defined weight vectors stored in the memory, resulting in a selected weight vector. At 708, a signal that comprises the selected weight vector multiplied with the sounding reference signal can be transmitted to the network device during the selected weight vector cycling. The selected weight vector can be used for a transmission of a sounding reference signal. According to some implementations, selecting the weight vector from the defined weight vectors stored in the memory can comprise randomly selecting the weight vector from the group of defined weight vectors. In some implementations, the selected weight vector can be used for an entire bandwidth for the transmission of the signal that comprises the selected weight vector multiplied with the sounding reference signal.

In an example, the uplink channel is a physical uplink shared channel, and selecting the weight vector from the group of defined weight vectors can facilitate a transmission diversity associated with transmissions of the device. In some implementations, transmitting the selected weight vector multiplied with the sounding reference signal during the selected weight vector cycling can comprise transmitting data via a downlink control channel configured to operate according to a fifth-generation wireless communication network protocol.

According to some implementations, the selected weight vector is a first weight vector and the transmission of the signal is a first transmission of a first signal. Further to these implementations, based on the selected weight vector cycling, a second weight vector can be selected for a second transmission of a second signal that comprises the second weight vector multiplied with the second sounding reference signal. For example, selecting the first weight vector and selecting the second weight vector can be based on a defined granularity level associated with the first transmission and the second transmission.

Figure 8:
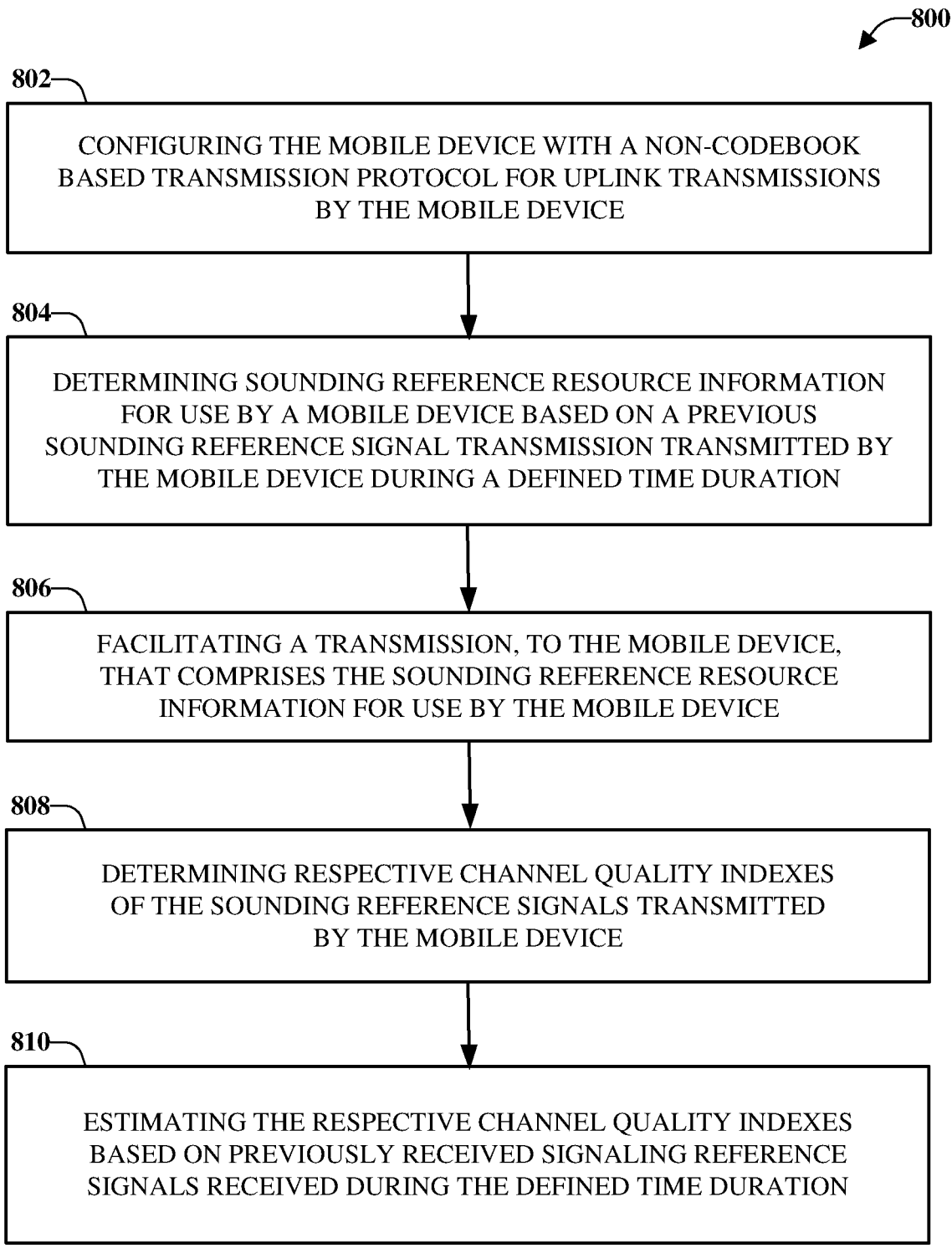
FIG. 8 illustrates an example, non-limiting method for facilitating selection of a weight vector from a group of defined weight vectors in order to estimate a channel quality index of a transmission diversity protocol in accordance with one or more embodiments described herein.

FIG. 8 illustrates an example, non-limiting, method 800 for facilitating selection of a weight vector from a group of defined weight vectors in order to estimate a channel quality index of a transmission diversity protocol in accordance with one or more embodiments described herein. Repetitive description of like elements employed in other embodiments described herein is omitted for sake of brevity. The method 800 can be implemented by a network device of a wireless network, the network device comprising a processor. Alternatively, or additionally, a machine-readable storage medium can comprise executable instructions that, when executed by a processor, facilitate performance of operations for the method 800.

The network device (e.g., the network device 102) can, at 802, configure a mobile device (e.g., the mobile device 104) with a non-codebook based transmission protocol for uplink transmissions by the mobile device. At 804, the network device can determine sounding reference resource information for use by the mobile device based on a previous sounding reference signal transmission transmitted by the mobile device during a defined time duration. Further, at 806, the network device can facilitate a transmission, to the mobile device, that comprises the sounding reference resource information for use by the mobile device.

At 808, the network device can determine respective channel quality indexes of the sounding reference signals transmitted by the mobile device. In an example, determining the respective channel quality indexes can comprise, at 810, estimating the respective channel quality indexes based on previously received signaling reference signals that are received during the defined time duration.

Described herein are systems, methods, articles of manufacture, and other embodiments or implementations that can facilitate semi-open loop based transmission diversity for uplink transmissions for a 5G network. Facilitating semi-open loop based transmission diversity for uplink transmissions in a 5G network can be implemented in connection with any type of device with a connection to the communications network (e.g., a mobile handset, a computer, a handheld device, etc.) any Internet of things (IoT) device (e.g., toaster, coffee maker, blinds, music players, speakers, etc.), and/or any connected vehicles (cars, airplanes, space rockets, and/or other at least partially automated vehicles (e.g., drones)). In some embodiments, the non-limiting term User Equipment (UE) is used. It can refer to any type of wireless device that communicates with a radio network node in a cellular or mobile communication system. Examples of UE are target device, device to device (D2D) UE, machine type UE or UE capable of machine to machine (M2M) communication, PDA, Tablet, mobile terminals, smart phone, Laptop Embedded Equipped (LEE), laptop mounted equipment (LME), USB dongles etc. Note that the terms element, elements and antenna ports can be interchangeably used but carry the same meaning in this disclosure. The embodiments are applicable to single carrier as well as to Multi-Carrier (MC) or Carrier Aggregation (CA) operation of the UE. The term Carrier Aggregation (CA) is also called (e.g., interchangeably called) "multi-carrier system," "multi-cell operation," "multi-carrier operation," "multi-carrier" transmission and/or reception.

In some embodiments, the non-limiting term radio network node or simply network node is used. It can refer to any type of network node that serves one or more UEs and/or that is coupled to other network nodes or network elements or any radio node from where the one or more UEs receive a signal. Examples of radio network nodes are Node B, Base Station (BS), Multi-Standard Radio (MSR) node such as MSR BS, eNode B, network controller, Radio Network Controller (RNC), Base Station Controller (BSC), relay, donor node controlling relay, Base Transceiver Station (BTS), Access Point (AP), transmission points, transmission nodes, RRU, RRH, nodes in Distributed Antenna System (DAS) etc.

Cloud Radio Access Networks (RAN) can enable the implementation of concepts such as Software-Defined Network (SDN) and Network Function Virtualization (NFV) in 5G networks. This disclosure can facilitate a generic channel state information framework design for a 5G network. Certain embodiments of this disclosure can comprise an SDN controller that can control routing of traffic within the network and between the network and traffic destinations. The SDN controller can be merged with the 5G network architecture to enable service deliveries via open Application Programming Interfaces (APIs) and move the network core towards an all Internet Protocol (IP), cloud based, and software driven telecommunications network. The SDN controller can work with, or take the place of Policy and Charging Rules Function (PCRF) network elements so that policies such as quality of service and traffic management and routing can be synchronized and managed end to end.

To meet the huge demand for data centric applications, 4G standards can be applied to 5G, also called New Radio (NR) access. 5G networks can comprise the following: data rates of several tens of megabits per second supported for tens of thousands of users; 1 gigabit per second can be offered simultaneously (or concurrently) to tens of workers on the same office floor; several hundreds of thousands of simultaneous (or concurrent) connections can be supported for massive sensor deployments; spectral efficiency can be enhanced compared to 4G; improved coverage; enhanced signaling efficiency; and reduced latency compared to LTE. In multicarrier system such as OFDM, each subcarrier can occupy bandwidth (e.g., subcarrier spacing). If the carriers use the same bandwidth spacing, then it can be considered a single numerology. However, if the carriers occupy different bandwidth and/or spacing, then it can be considered a multiple numerology.

Figure 9:
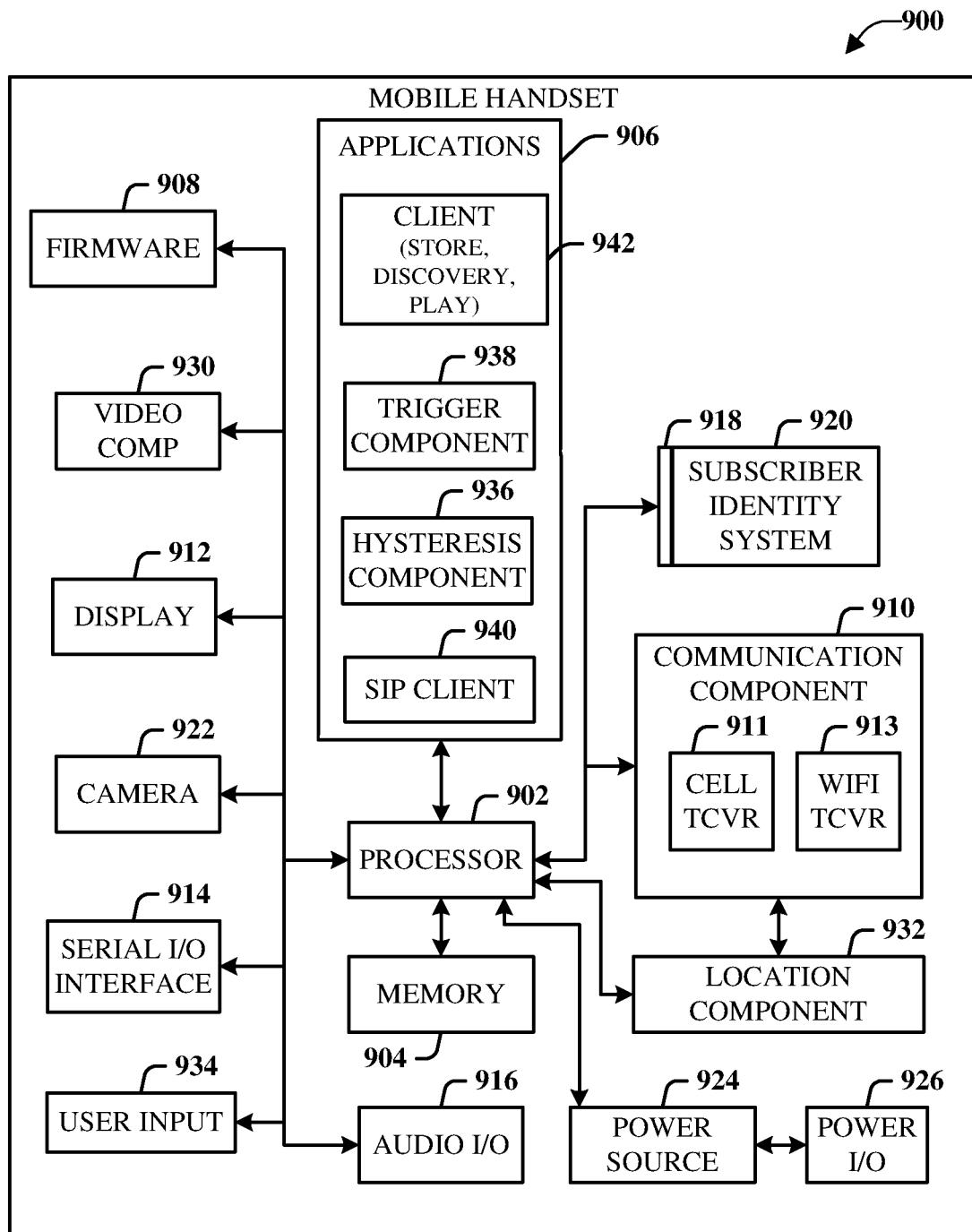
FIG. 9 illustrates an example block diagram of an example mobile handset operable to engage in a system architecture that facilitates wireless communications according to one or more embodiments described herein.

Referring now to FIG. 9, illustrated is an example block diagram of an example mobile handset 900 operable to engage in a system architecture that facilitates wireless communications according to one or more embodiments described herein. Although a mobile handset is illustrated herein, it will be understood that other devices can be a mobile device, and that the mobile handset is merely illustrated to provide context for the embodiments of the various embodiments described herein. The following discussion is intended to provide a brief, general description of an example of a suitable environment in which the various embodiments can be implemented. While the description includes a general context of computer-executable instructions embodied on a machine-readable storage medium, those skilled in the art will recognize that the innovation also can be implemented in combination with other program modules and/or as a combination of hardware and software.

Generally, applications (e.g., program modules) can include routines, programs, components, data structures, etc., that perform particular tasks or implement particular abstract data types. Moreover, those skilled in the art will appreciate that the methods described herein can be practiced with other system configurations, including single-processor or multiprocessor systems, minicomputers, mainframe computers, as well as personal computers, hand-held computing devices, microprocessor-based or programmable consumer electronics, and the like, each of which can be operatively coupled to one or more associated devices.

A computing device can typically include a variety of machine-readable media. Machine-readable media can be any available media that can be accessed by the computer and includes both volatile and non-volatile media, removable and non-removable media. By way of example and not limitation, computer-readable media can comprise computer storage media and communication media. Computer storage media can include volatile and/or non-volatile media, removable and/or non-removable media implemented in any method or technology for storage of information, such as computer-readable instructions, data structures, program modules, or other data. Computer storage media can include, but is not limited to, RAM, ROM, EEPROM, flash memory or other memory technology, solid state drive (SSD) or other solid-state storage technology, Compact Disk Read Only Memory (CD ROM), digital video disk (DVD), Blu-ray disk, or other optical disk storage, magnetic cassettes, magnetic tape, magnetic disk storage or other magnetic storage devices, or any other medium which can be used to store the desired information and which can be accessed by the computer. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Communication media typically embodies computer-readable instructions, data structures, program modules, or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

The handset includes a processor 902 for controlling and processing all onboard operations and functions. A memory 904 interfaces to the processor 902 for storage of data and one or more applications 906 (e.g., a video player software, user feedback component software, etc.). Other applications can include voice recognition of predetermined voice commands that facilitate initiation of the user feedback signals. The applications 906 can be stored in the memory 904 and/or in a firmware 908, and executed by the processor 902 from either or both the memory 904 or/and the firmware 908. The firmware 908 can also store startup code for execution in initializing the handset 900. A communications component 910 interfaces to the processor 902 to facilitate wired/wireless communication with external systems, e.g., cellular networks, VoIP networks, and so on. Here, the communications component 910 can also include a suitable cellular transceiver 911 (e.g., a GSM transceiver) and/or an unlicensed transceiver 913 (e.g., Wi-Fi, WiMax) for corresponding signal communications. The handset 900 can be a device such as a cellular telephone, a PDA with mobile communications capabilities, and messaging-centric devices. The communications component 910 also facilitates communications reception from terrestrial radio networks (e.g., broadcast), digital satellite radio networks, and Internet-based radio services networks.

The handset 900 includes a display 912 for displaying text, images, video, telephony functions (e.g., a Caller ID function), setup functions, and for user input. For example, the display 912 can also be referred to as a "screen" that can accommodate the presentation of multimedia content (e.g., music metadata, messages, wallpaper, graphics, etc.). The display 912 can also display videos and can facilitate the generation, editing and sharing of video quotes. A serial I/O interface 914 is provided in communication with the processor 902 to facilitate wired and/or wireless serial communications (e.g., USB, and/or IEEE 1394) through a hardwire connection, and other serial input devices (e.g., a keyboard, keypad, and mouse). This supports updating and troubleshooting the handset 900, for example. Audio capabilities are provided with an audio I/O component 916, which can include a speaker for the output of audio signals related to, for example, indication that the user pressed the proper key or key combination to initiate the user feedback signal. The audio I/O component 916 also facilitates the input of audio signals through a microphone to record data and/or telephony voice data, and for inputting voice signals for telephone conversations.

The handset 900 can include a slot interface 918 for accommodating a SIC (Subscriber Identity Component) in the form factor of a card Subscriber Identity Module (SIM) or universal SIM 920, and interfacing the SIM card 920 with the processor 902. However, it is to be appreciated that the SIM card 920 can be manufactured into the handset 900, and updated by downloading data and software.

The handset 900 can process IP data traffic through the communications component 910 to accommodate IP traffic from an IP network such as, for example, the Internet, a corporate intranet, a home network, a person area network, etc., through an ISP or broadband cable provider. Thus, VoIP traffic can be utilized by the handset 900 and IP-based multimedia content can be received in either an encoded or a decoded format.

A video processing component 922 (e.g., a camera) can be provided for decoding encoded multimedia content. The video processing component 922 can aid in facilitating the generation, editing, and sharing of video quotes. The handset 900 also includes a power source 924 in the form of batteries and/or an AC power subsystem, which power source 924 can interface to an external power system or charging equipment (not shown) by a power I/O component 926.

The handset 900 can also include a video component 930 for processing video content received and, for recording and transmitting video content. For example, the video component 930 can facilitate the generation, editing and sharing of video quotes. A location tracking component 932 facilitates geographically locating the handset 900. As described hereinabove, this can occur when the user initiates the feedback signal automatically or manually. A user input component 934 facilitates the user initiating the quality feedback signal. The user input component 934 can also facilitate the generation, editing and sharing of video quotes. The user input component 934 can include such conventional input device technologies such as a keypad, keyboard, mouse, stylus pen, and/or touch screen, for example.

Referring again to the applications 906, a hysteresis component 936 facilitates the analysis and processing of hysteresis data, which is utilized to determine when to associate with the access point. A software trigger component 938 can be provided that facilitates triggering of the hysteresis component 936 when the Wi-Fi transceiver 913 detects the beacon of the access point. A SIP client 940 enables the handset 900 to support SIP protocols and register the subscriber with the SIP registrar server. The applications 906 can also include a client 942 that provides at least the capability of discovery, play and store of multimedia content, for example, music.

The handset 900, as indicated above related to the communications component 910, includes an indoor network radio transceiver 913 (e.g., Wi-Fi transceiver). This function supports the indoor radio link, such as IEEE 802.11, for the dual-mode GSM handset 900. The handset 900 can accommodate at least satellite radio services through a handset that can combine wireless voice and digital radio chipsets into a single handheld device.

Figure 10:
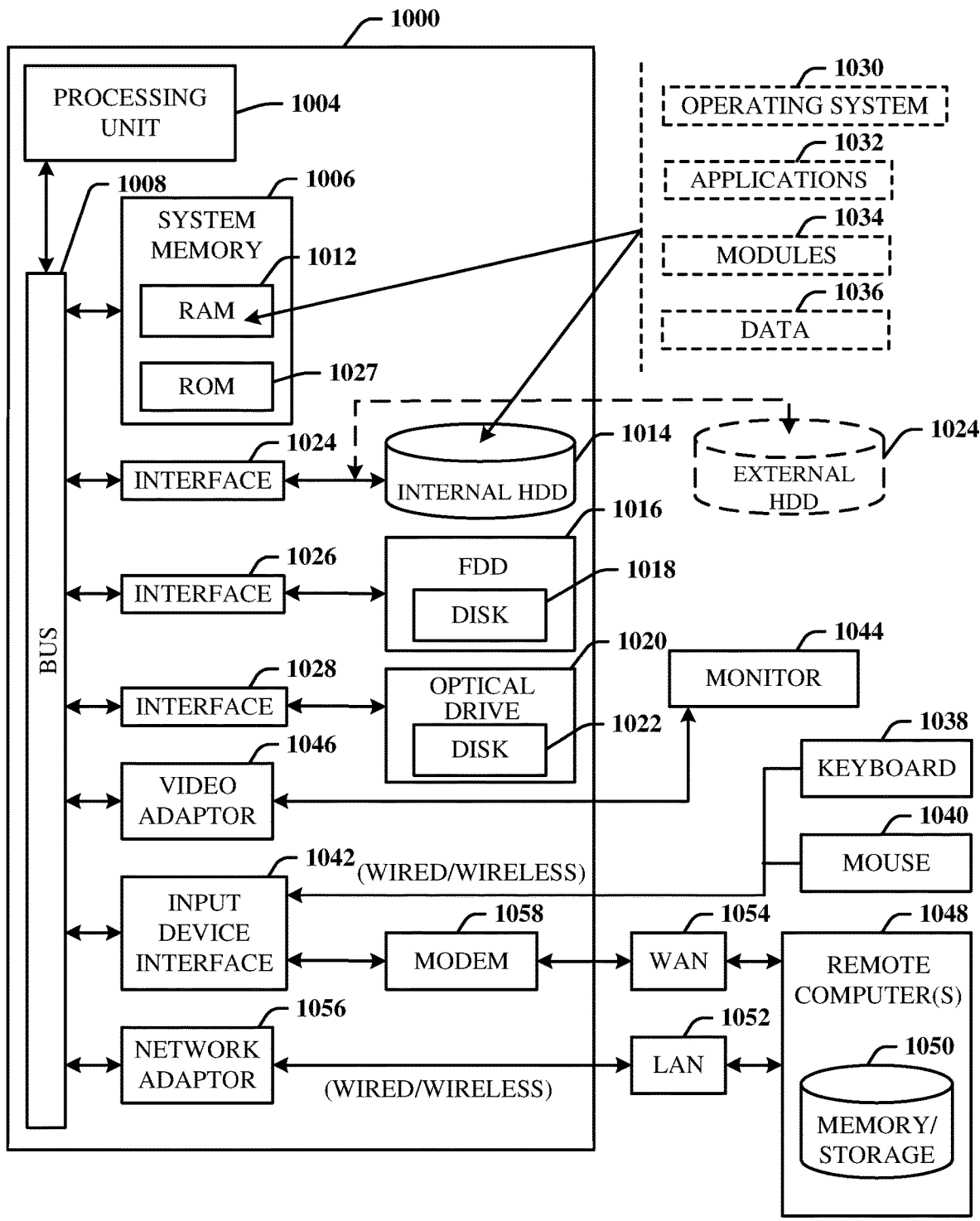
FIG. 10 illustrates an example block diagram of an example computer operable to engage in a system architecture that facilitates wireless communications according to one or more embodiments described herein.

Referring now to FIG. 10, illustrated is an example block diagram of an example computer 1000 operable to engage in a system architecture that facilitates wireless communications according to one or more embodiments described herein. The computer 1000 can provide networking and communication capabilities between a wired or wireless communication network and a server (e.g., Microsoft server) and/or communication device. In order to provide additional context for various aspects thereof, FIG. 10 and the following discussion are intended to provide a brief, general description of a suitable computing environment in which the various aspects of the innovation can be implemented to facilitate the establishment of a transaction between an entity and a third party. While the description above is in the general context of computer-executable instructions that can run on one or more computers, those skilled in the art will recognize that the innovation also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the various methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the innovation can also be practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media or communications media, which two terms are used herein differently from one another as follows.

Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media can embody computer-readable instructions, data structures, program modules, or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference to FIG. 10, implementing various aspects described herein with regards to the end-user device can include a computer 1000, the computer 1000 including a processing unit 1004, a system memory 1006 and a system bus 1008. The system bus 1008 couples system components including, but not limited to, the system memory 1006 to the processing unit 1004. The processing unit 1004 can be any of various commercially available processors. Dual microprocessors and other multi processor architectures can also be employed as the processing unit 1004.

The system bus 1008 can be any of several types of bus structure that can further interconnect to a memory bus (with or without a memory controller), a peripheral bus, and a local bus using any of a variety of commercially available bus architectures. The system memory 1006 includes read-only memory (ROM) 1027 and random access memory (RAM) 1012. A basic input/output system (BIOS) is stored in a non-volatile memory 1027 such as ROM, EPROM, EEPROM, which BIOS contains the basic routines that help to transfer information between elements within the computer 1000, such as during start-up. The RAM 1012 can also include a high-speed RAM such as static RAM for caching data.

The computer 1000 further includes an internal hard disk drive (HDD) 1014 (e.g., EIDE, SATA), which internal hard disk drive 1014 can also be configured for external use in a suitable chassis (not shown), a magnetic floppy disk drive (FDD) 1016, (e.g., to read from or write to a removable diskette 1018) and an optical disk drive 1020, (e.g., reading a CD-ROM disk 1022 or, to read from or write to other high capacity optical media such as the DVD). The hard disk drive 1014, magnetic disk drive 1016 and optical disk drive 1020 can be connected to the system bus 1008 by a hard disk drive interface 1024, a magnetic disk drive interface 1026 and an optical drive interface 1028, respectively. The interface 1024 for external drive implementations includes at least one or both of Universal Serial Bus (USB) and IEEE 1394 interface technologies. Other external drive connection technologies are within contemplation of the subject innovation.

The drives and their associated computer-readable media provide nonvolatile storage of data, data structures, computer-executable instructions, and so forth. For the computer 1000 the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer 1000, such as zip drives, magnetic cassettes, flash memory cards, cartridges, and the like, can also be used in the exemplary operating environment, and further, that any such media can contain computer-executable instructions for performing the methods of the disclosed innovation.

A number of program modules can be stored in the drives and RAM 1012, including an operating system 1030, one or more application programs 1032, other program modules 1034 and program data 1036. All or portions of the operating system, applications, modules, and/or data can also be cached in the RAM 1012. It is to be appreciated that the innovation can be implemented with various commercially available operating systems or combinations of operating systems.

A user can enter commands and information into the computer 1000 through one or more wired/wireless input devices, e.g., a keyboard 1038 and a pointing device, such as a mouse 1040. Other input devices (not shown) can include a microphone, an IR remote control, a joystick, a game pad, a stylus pen, touch screen, or the like. These and other input devices are often connected to the processing unit 1004 through an input device interface 1042 that is coupled to the system bus 1008, but can be connected by other interfaces, such as a parallel port, an IEEE 1394 serial port, a game port, a USB port, an IR interface, etc.

A monitor 1044 or other type of display device is also connected to the system bus 1008 through an interface, such as a video adapter 1046. In addition to the monitor 1044, a computer 1000 typically includes other peripheral output devices (not shown), such as speakers, printers, etc.

The computer 1000 can operate in a networked environment using logical connections by wired and/or wireless communications to one or more remote computers, such as a remote computer(s) 1048. The remote computer(s) 1048 can be a workstation, a server computer, a router, a personal computer, portable computer, microprocessor-based entertainment device, a peer device or other common network node, and typically includes many or all of the elements described relative to the computer, although, for purposes of brevity, only a memory/storage device 1050 is illustrated. The logical connections depicted include wired/wireless connectivity to a local area network (LAN) 1052 and/or larger networks, e.g., a wide area network (WAN) 1054. Such LAN and WAN networking environments are commonplace in offices and companies, and facilitate enterprise-wide computer networks, such as intranets, all of which can connect to a global communications network, e.g., the Internet.

When used in a LAN networking environment, the computer 1000 is connected to the local network 1052 through a wired and/or wireless communication network interface or adapter 1056. The adapter 1056 can facilitate wired or wireless communication to the LAN 1052, which can also include a wireless access point disposed thereon for communicating with the wireless adapter 1056.

When used in a WAN networking environment, the computer 1000 can include a modem 1058, or is connected to a communications server on the WAN 1054, or has other means for establishing communications over the WAN 1054, such as by way of the Internet. The modem 1058, which can be internal or external and a wired or wireless device, is connected to the system bus 1008 through the input device interface 1042. In a networked environment, program modules depicted relative to the computer, or portions thereof, can be stored in the remote memory/storage device 1050. It will be appreciated that the network connections shown are exemplary and other means of establishing a communications link between the computers can be used.

The computer is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, etc.) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 2.4 and 5 GHz radio bands, at an 11 Mbps (802.11a) or 54 Mbps (802.11b) data rate, for example, or with products that contain both bands (dual band), so the networks can provide real-world performance similar to the basic 10BaseT wired Ethernet networks used in many offices.

An aspect of 5G, which differentiates from previous 4G systems, is the use of NR. NR architecture can be designed to support multiple deployment cases for independent configuration of resources used for RACH procedures. Since the NR can provide additional services than those provided by LTE, efficiencies can be generated by leveraging the pros and cons of LTE and NR to facilitate the interplay between LTE and NR, as discussed herein.

Reference throughout this specification to "one embodiment," or "an embodiment," means that a particular feature, structure, or characteristic described in connection with the embodiment is included in at least one embodiment. Thus, the appearances of the phrase "in one embodiment," "in one aspect," or "in an embodiment," in various places throughout this specification are not necessarily all referring to the same embodiment. Furthermore, the particular features, structures, or characteristics can be combined in any suitable manner in one or more embodiments.

As used in this disclosure, in some embodiments, the terms "component," "system," "interface," and the like are intended to refer to, or comprise, a computer-related entity or an entity related to an operational apparatus with one or more specific functionalities, wherein the entity can be either hardware, a combination of hardware and software, software, or software in execution, and/or firmware. As an example, a component can be, but is not limited to being, a process running on a processor, a processor, an object, an executable, a thread of execution, computer-executable instructions, a program, and/or a computer. By way of illustration and not limitation, both an application running on a server and the server can be a component.

One or more components can reside within a process and/or thread of execution and a component can be localized on one computer and/or distributed between two or more computers. In addition, these components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software application or firmware application executed by one or more processors, wherein the processor can be internal or external to the apparatus and can execute at least a part of the software or firmware application. As yet another example, a component can be an apparatus that provides specific functionality through electronic components without mechanical parts, the electronic components can comprise a processor therein to execute software or firmware that confer(s) at least in part the functionality of the electronic components. In an aspect, a component can emulate an electronic component via a virtual machine, e.g., within a cloud computing system. While various components have been illustrated as separate components, it will be appreciated that multiple components can be implemented as a single component, or a single component can be implemented as multiple components, without departing from example embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, terms such as "mobile device equipment," "mobile station," "mobile," subscriber station," "access terminal," "terminal," "handset," "communication device," "mobile device" (and/or terms representing similar terminology) can refer to a wireless device utilized by a subscriber or mobile device of a wireless communication service to receive or convey data, control, voice, video, sound, gaming or substantially any data-stream or signaling-stream. The foregoing terms are utilized interchangeably herein and with reference to the related drawings. Likewise, the terms "access point (AP)," "Base Station (BS)," BS transceiver, BS device, cell site, cell site device, "Node B (NB)," "evolved Node B (eNode B)," "home Node B (HNB)" and the like, are utilized interchangeably in the application, and refer to a wireless network component or appliance that transmits and/or receives data, control, voice, video, sound, gaming or substantially any data-stream or signaling-stream from one or more subscriber stations. Data and signaling streams can be packetized or frame-based flows.

Furthermore, the terms "device," "communication device," "mobile device," "subscriber," "customer entity," "consumer," "customer entity," "entity" and the like are employed interchangeably throughout, unless context warrants particular distinctions among the terms. It should be appreciated that such terms can refer to human entities or automated components supported through artificial intelligence (e.g., a capacity to make inference based on complex mathematical formalisms), which can provide simulated vision, sound recognition and so forth.

Embodiments described herein can be exploited in substantially any wireless communication technology, comprising, but not limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Z-Wave, Zigbee and other 802.XX wireless technologies and/or legacy telecommunication technologies.

Systems, methods and/or machine-readable storage media for facilitating a two-stage downlink control channel for 5G systems are provided herein. Legacy wireless systems such as LTE, Long-Term Evolution Advanced (LTE-A), High Speed Packet Access (HSPA) etc. use fixed modulation format for downlink control channels. Fixed modulation format implies that the downlink control channel format is always encoded with a single type of modulation (e.g., quadrature phase shift keying (QPSK)) and has a fixed code rate. Moreover, the forward error correction (FEC) encoder uses a single, fixed mother code rate of ⅓ with rate matching. This design does not take into the account channel statistics. For example, if the channel from the BS device to the mobile device is very good, the control channel cannot use this information to adjust the modulation, code rate, thereby unnecessarily allocating power on the control channel. Similarly, if the channel from the BS to the mobile device is poor, then there is a probability that the mobile device might not able to decode the information received with only the fixed modulation and code rate. As used herein, the term "infer" or "inference" refers generally to the process of reasoning about, or inferring states of, the system, environment, user, and/or intent from a set of observations as captured via events and/or data. Captured data and events can include user data, device data, environment data, data from sensors, sensor data, application data, implicit data, explicit data, etc. Inference can be employed to identify a specific context or action, or can generate a probability distribution over states of interest based on a consideration of data and events, for example.

Inference can also refer to techniques employed for composing higher-level events from a set of events and/or data. Such inference results in the construction of new events or actions from a set of observed events and/or stored event data, whether the events are correlated in close temporal proximity, and whether the events and data come from one or several event and data sources. Various classification schemes and/or systems (e.g., support vector machines, neural networks, expert systems, Bayesian belief networks, fuzzy logic, and data fusion engines) can be employed in connection with performing automatic and/or inferred action in connection with the disclosed subject matter.

In addition, the various embodiments can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, machine-readable device, computer-readable carrier, computer-readable media, machine-readable media, computer-readable (or machine-readable) storage/communication media. For example, computer-readable media can comprise, but are not limited to, a magnetic storage device, e.g., hard disk; floppy disk; magnetic strip(s); an optical disk (e.g., compact disk (CD), a digital video disc (DVD), a Blu-ray Disc™ (BD)); a smart card; a flash memory device (e.g., card, stick, key drive); and/or a virtual device that emulates a storage device and/or any of the above computer-readable media. Of course, those skilled in the art will recognize many modifications can be made to this configuration without departing from the scope or spirit of the various embodiments The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the subject matter has been described herein in connection with various embodiments and corresponding FIGs, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A method, comprising:
   determining, by network equipment comprising a processor, a weight vector cycling for use by a user equipment during an uplink transmission based on a defined resource block granularity level and a previous sounding reference signal transmission transmitted by the user equipment during a defined time duration, wherein the weight vector cycling is determined based on a candidate group of weight vectors that are predefined for the user equipment based on the previous sounding reference signal transmission; and determining, by the network equipment, sounding reference resource information for the use by the user equipment during the uplink transmission based on the weight vector cycling.

2. The method of claim 1, wherein the determining of the weight vector cycling further comprises determining the weight vector cycling based on a number of weight vectors for an entire bandwidth of the previous sounding reference signal transmission received by the user equipment during the defined time duration.

3. The method of claim 1, further comprising:
determining, by the network equipment, respective channel quality indexes of the sounding reference resource information transmitted by the user equipment.

4. The method of claim 3, further comprising:
estimating, by the network equipment, the respective channel quality indexes based on signaling reference signals received during the defined time duration.

5. The method of claim 1, further comprising:
facilitating, by the network equipment, a transmission that comprises the sounding reference resource information for the use by the user equipment.

6. The method of claim 1, further comprising:
prior to the determining of the sounding reference resource information, receiving, by the network equipment, a configuration of a non-codebook based transmission protocol for an uplink channel.

7. The method of claim 1, further comprising:
configuring, by the network equipment, the user equipment with a non-codebook based transmission protocol for the uplink transmission by the user equipment.

8. The method of claim 1, wherein the defined time duration is a time window prior to a current time and comprises a configurable length.

9. The method of claim 1, wherein the user equipment is configured to operate according to a fifth generation network communication protocol.

10. A system, comprising:
a processor; and
a memory that stores executable instructions that, when executed by the processor, facilitate performance of operations, comprising:
selecting a first weight vector from a group of defined weight vectors based on a first defined granularity level associated with a first transmission of an uplink transmission and received sounding resource information for use during the uplink transmission; and
selecting a second weight vector from the group of defined weight vectors based on a second defined granularity level associated with a second transmission of the uplink transmission and the received sounding resource information, wherein the first defined granularity level and the second defined granularity level are determined based on respective physical resource group levels of the first transmission and the second transmission, and wherein the group of defined weight vectors are determined, prior to the selecting of the first weight vector, based on a result of use of weight vectors of the group of defined weight vectors during a preceding time period to transmit sounding reference signals.

11. The system of claim 10, wherein the operations further comprise:

prior to the selecting of the first weight vector, determining a number of weight vectors for an entire bandwidth of a sounding reference signal, resulting in a selected weight vector cycling.

12. The system of claim 10, wherein the operations further comprise:
prior to selecting the first weight vector, receiving a configuration of a non-codebook based transmission protocol applicable to an uplink channel.

13. The system of claim 10, wherein the operations further comprise:
facilitating the first transmission of the uplink transmission using a first multiple of the first weight vector and a sounding reference signal and the second transmission of the uplink transmission using a second multiple of the second weight vector and the sounding reference signal.

14. The system of claim 13, wherein the facilitating comprises periodically sending a sounding reference resource transmission.

15. The system of claim 13, wherein the facilitating comprises aperiodically sending a sounding reference resource transmission.

16. The system of claim 10, wherein the received sounding resource information comprises sounding reference resource information determined to have been used to transmit sounding reference signals during a defined previous duration.

17. A non-transitory machine-readable medium, comprising executable instructions that, when executed by a processor, facilitate performance of operations, comprising:
selecting a first weight vector from a group of defined weight vectors for a first transmission of a first signal, wherein selecting the first weight vector is based on a first defined granularity level determined based on a first resource block level of the first transmission; and
selecting a second weight vector from the group of defined weight vectors for a second transmission of a second signal, wherein selecting the second weight vector is based on a second defined granularity level determined based on a second resource block level of the second transmission, and wherein the group of defined weight vectors comprises weight vectors determined, prior to the selecting of the first weight vector, based on a result of use of the weight vectors of the group of defined weight vectors during a preceding time period to transmit sounding reference signals.

18. The non-transitory machine-readable medium of claim 17, wherein the group of defined weight vectors comprises weight vectors used to transmit sounding reference signals during a defined time duration.

19. The non-transitory machine-readable medium of claim 17, wherein the operations further comprise:
transmitting, to network equipment, a signal that comprises the first weight vector multiplied with a sounding reference signal during a selected weight vector cycling.

20. The non-transitory machine-readable medium of claim 19, wherein the transmitting comprises transmitting data via a downlink control channel configured to operate according to a fifth generation communication network protocol.

* * * * *